(12) United States Patent
Yeh et al.

(10) Patent No.: US 9,019,715 B2
(45) Date of Patent: Apr. 28, 2015

(54) TOUCH PANEL AND TOUCH DISPLAY PANEL

(71) Applicant: AU Optronics Corp., Hsin-Chu (TW)

(72) Inventors: Chia-Chun Yeh, Hsin-Chu (TW); Po-Yuan Liu, Hsin-Chu (TW); Wen-Chi Chuang, Hsin-Chu (TW); Pei-Jung Wu, Hsin-Chu (TW); Cheng-Ta Ho, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 312 days.

(21) Appl. No.: 13/775,233

(22) Filed: Feb. 24, 2013

(65) Prior Publication Data

US 2013/0258613 A1   Oct. 3, 2013

(30) Foreign Application Priority Data

Apr. 2, 2012   (TW) .............................. 101111699 A

(51) Int. Cl.
*H05K 1/18* (2006.01)
*H05K 1/02* (2006.01)
*G06F 3/044* (2006.01)

(52) U.S. Cl.
CPC .............. *H05K 1/0271* (2013.01); *G06F 3/044* (2013.01); *G06F 2203/04107* (2013.01)

(58) Field of Classification Search
USPC .......... 361/749–750, 760–762; 174/250–258; 349/100–150
See application file for complete search history.

(56) References Cited

U.S. PATENT DOCUMENTS

2008/0186434 A1* 8/2008 Yun et al. ...................... 349/106
2011/0304564 A1* 12/2011 Kim et al. ..................... 345/173
2012/0175607 A1* 7/2012 Shu et al. ........................ 257/43

FOREIGN PATENT DOCUMENTS

TW          M303618       12/2006

* cited by examiner

*Primary Examiner* — Tuan T Dinh
(74) *Attorney, Agent, or Firm* — Winston Hsu; Scott Margo

(57) ABSTRACT

A touch panel includes a substrate, a transparent sensor electrode pattern, a patterned compensation electrode, a passivation layer, a transparent shielding electrode and at least one connection structure. The substrate has a surface and includes a sensor region and a peripheral region. The transparent sensor electrode pattern is disposed on the surface of the substrate and in the sensor region. The patterned compensation electrode is disposed on the surface of the substrate and in the peripheral region, and the patterned compensation electrode and the transparent sensor electrode pattern are electrically isolated. The passivation layer is disposed on the surface of the substrate, covers the transparent sensor electrode pattern, and at least partially exposes the patterned compensation electrode. The transparent shielding electrode is disposed on the passivation layer. The connection structure is electrically connected to the transparent shielding electrode and the patterned compensation electrode exposed by the passivation layer.

14 Claims, 8 Drawing Sheets

TOUCH PANEL AND TOUCH DISPLAY PANEL

BACKGROUND OF THE INVENTION

1. Field of the Invention

The disclosure relates to a touch panel and a touch display panel, and more particularly, to a touch panel and a touch display panel having a transparent shielding electrode and a patterned compensation electrode.

2. Description of the Prior Art

Due to its human-machine interactive feature, the touch panel has gradually replaced keyboard as the input interface of electronic device. In recent years, consumer electronics have been improved both in functionality and popularity. Therefore display panel integrated with touch function, so-called touch display panel is prevalently used in mobile phone, GPS navigator system, tablet PC, laptop PC, and so on.

The diverse touch panel operability can be classified into types such as resistive type, capacitive type, and optical type. Among those touch technologies, capacitive touch technology has become the mainstream touch technology for the high-end and the mid-end consumer electronics because the capacitive touch panel has advantages of high precision, multi-touch, better endurance, and higher touch resolution. By detecting the capacitance changes around a touch point, signals are transmitted and the touch point is recognized. However, it is found that the touch panel suffers mechanical distortion by the pressure applied from user. Such mechanical distortion causes deviation to capacitance change and thus adversely impacts touch accuracy of the touch panel.

SUMMARY OF THE INVENTION

It is therefore one of the objectives of the disclosure to provide a touch panel and a touch display panel having improved accuracy.

According to an embodiment of the disclosure, a touch panel is provided. The touch panel includes a substrate, a transparent sensor electrode pattern, a patterned compensation electrode, a passivation layer, a transparent shielding electrode, and at least one connection structure. The substrate includes a surface. The substrate includes a sensor region and a peripheral region. The transparent sensor electrode pattern is disposed on the surface of the substrate and in the sensor region. The patterned compensation electrode is disposed on the surface of the substrate and in the peripheral region. The patterned compensation electrode is electrically isolated from the transparent sensor electrode pattern. The passivation layer is disposed on the surface of the substrate. The passivation layer covers the transparent sensor electrode pattern and at least partially exposes the patterned compensation electrode. The transparent shielding electrode is disposed on the passivation layer. The connection structure is electrically connected to the transparent shielding electrode and the patterned compensation electrode exposed by the passivation layer.

According to another embodiment of the disclosure, a touch display panel is provided. The touch display panel includes a display panel, the touch panel as mentioned above, and an adhesive layer. The display panel includes a display surface. The touch panel is disposed on the display surface of the display panel. The adhesive layer is disposed in between the display panel and the touch panel for assembling the display panel and the touch panel.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-2 are schematic diagrams illustrating a touch panel provided by a first embodiment of the disclosure, wherein FIG. 1 is a top view of the touch panel; and FIG. 2 is a cross-sectional view taken along line A-A' of FIG. 1.

DETAILED DESCRIPTION

To provide a better understanding of the disclosure to the skilled users in the technology of the disclosure, preferred embodiments will be detailed as follows. The preferred embodiments of the disclosure are illustrated in the accompanying drawings with numbered elements to elaborate the contents and effects to be achieved.

Figure 1:
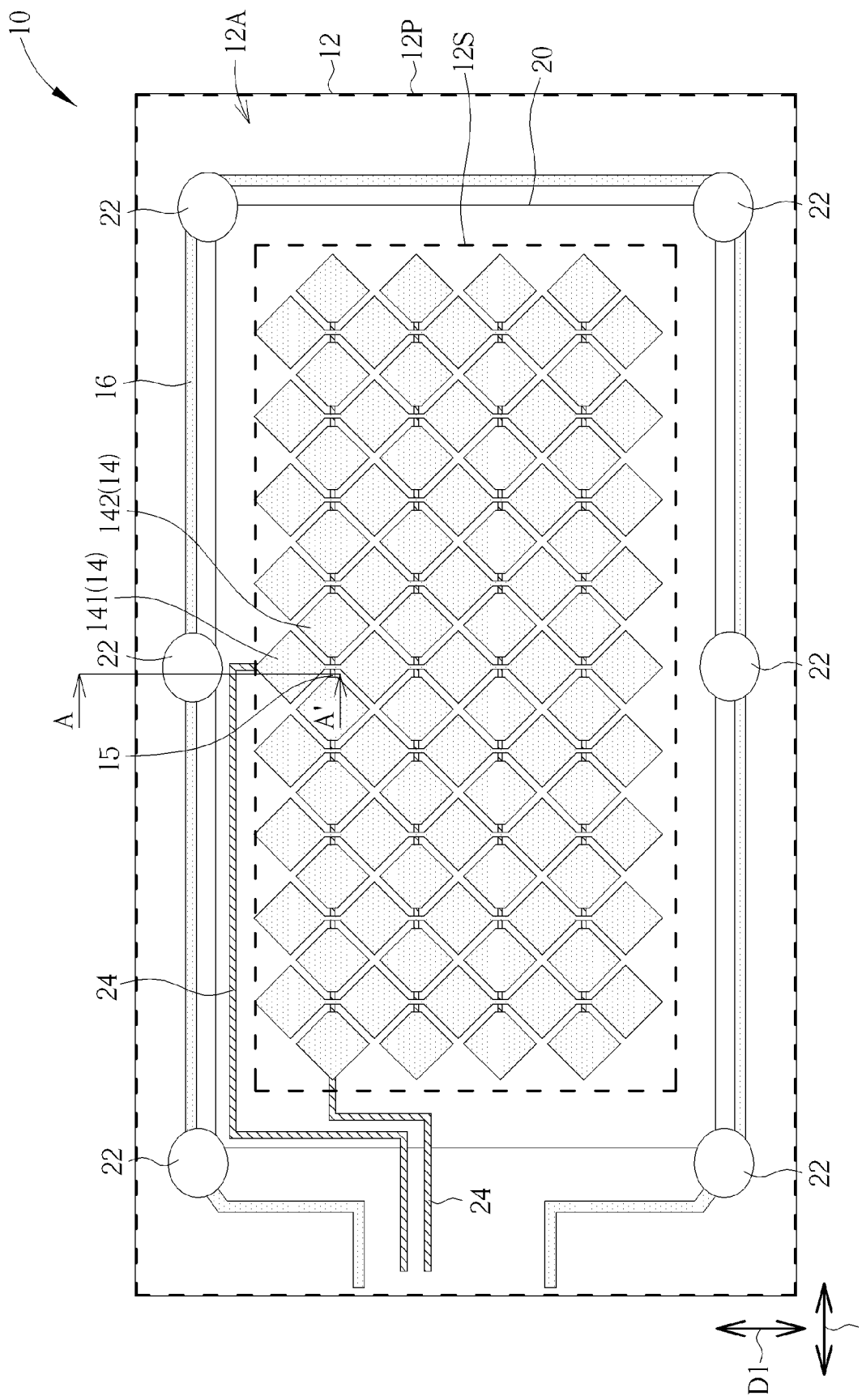
Figure 2:
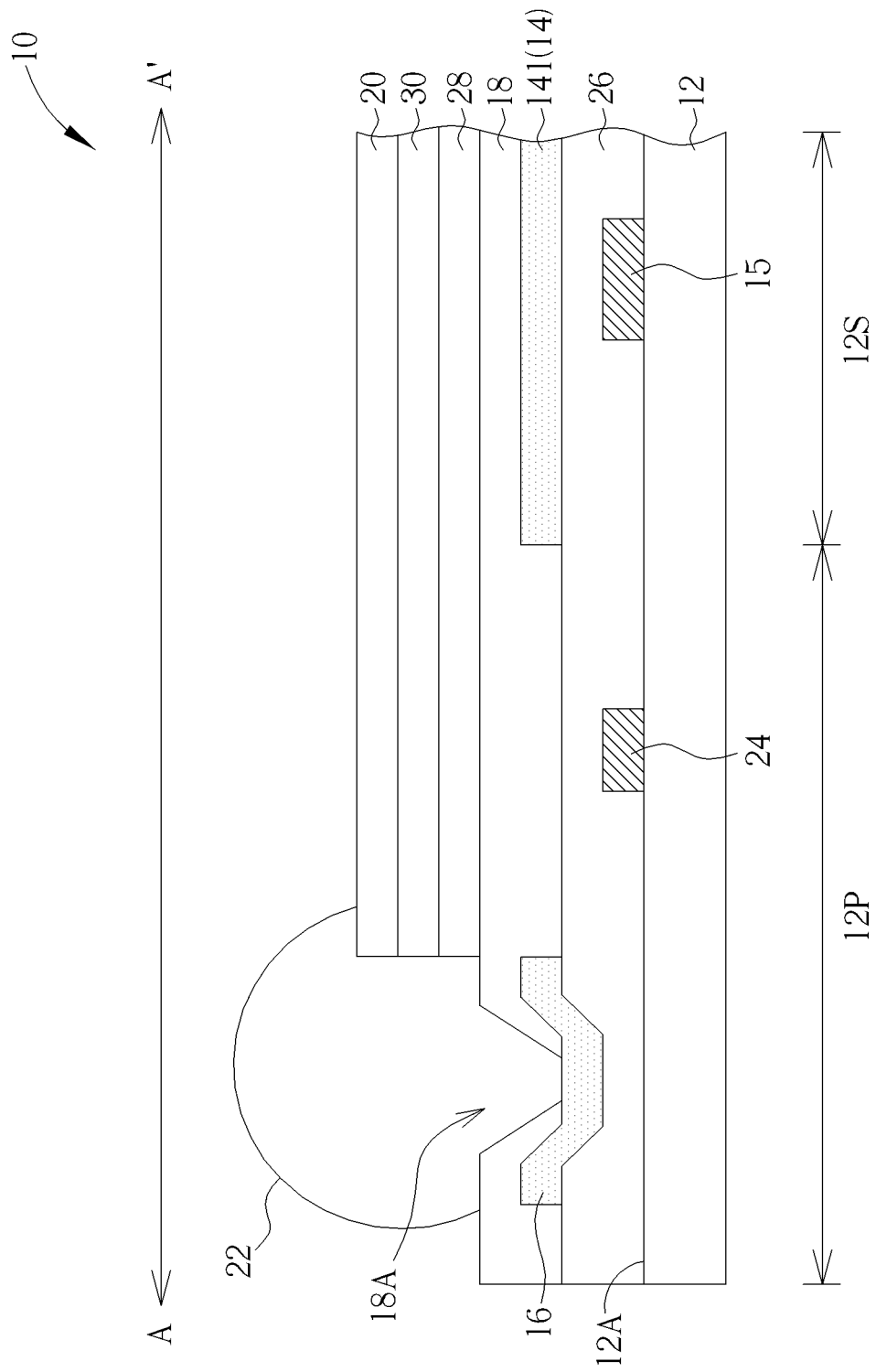

Please refer to FIG. 1 and FIG. 2, which are schematic diagrams illustrating a touch panel provided by a first preferred embodiment of the disclosure, wherein FIG. 1 is a top view of the touch panel and FIG. 2 is a cross-sectional view taken along line A-A' of FIG. 1. As shown in FIG. 1 and FIG. 2, the touch panel 10 includes a substrate 12, a transparent sensor electrode pattern 14, a patterned compensation electrode 16, a passivation layer 18 (not shown in FIG. 1), a transparent shielding electrode 20, and at least one connection structure 22. The substrate 12 can be a transparent substrate having a surface 12A. The substrate 12 includes a sensor region 12S and a peripheral region 12P. The peripheral region 12P is disposed outside of the sensor region 12S. The transparent sensor electrode pattern 14 is disposed on the surface 12A of the substrate 12, and in the sensor region 12S of the substrate 12. The transparent sensor electrode pattern 14 includes a plurality of first transparent sensor pads 141 and a plurality of second transparent sensor pads 142 (not shown in FIG. 2). The first transparent sensor pads 141 are disposed to extend along a first direction D1 and are electrically connected. The second transparent sensor pads 142 are disposed to extend along a second direction D2, and two adjacent second transparent sensor pads 142 are electrically connected to each other by a metal connecting bridge 15. Preferably, the first transparent sensor pads 141 are electrically isolated from the second transparent sensor pads 142. The patterned compensation electrode 16 is disposed on the surface 12A of the substrate 12, and in the peripheral region 12P of the substrate 12. The patterned compensation electrode 16 is electrically isolated from the transparent sensor electrode pattern 14. The passivation layer 18 is disposed on the surface 12A of the substrate 12. Furthermore, the passivation layer 18 covers the transparent sensor electrode pattern 14 and at least partially exposes the patterned compensation electrode 16. The transparent shielding electrode 20 is disposed on the passivation layer 18 and in the sensor region 12S. The transparent shielding electrode 20 disposed in the sensor region 12S may extend into the peripheral region 12P. The connection structure 22 is electrically connected to the transparent shielding electrode 20 and the patterned compensation electrode 16 exposed by the passivation layer 18.

The touch panel 10 of this embodiment further includes a plurality of signal lines 24, an insulating layer 26 (not shown in FIG. 1), an adhesive layer 28 (not shown in FIG. 1), and an optical film 30 (not shown in FIG. 1). The signal lines 24 are disposed in the peripheral region 12P of the substrate 12. A portion of the signal lines 24 are electrically connected to the first transparent sensor pads 141, and another portion of the signal lines 24 are electrically connected to the second transparent sensor pads 142. Accordingly, touch signals generated by the first transparent sensor pads 141 in the first direction D1 and by the second transparent sensor pads 142 in the second direction D2 are respectively delivered to the driving circuit (not shown). The insulating layer 26 is disposed on the substrate 12. The insulating layer 26 covers the metal connecting bridge 15 and the signal lines 24. The transparent sensor electrode pattern 14 is disposed on the insulating layer 26. The adhesive layer 28 and the optical film 30 are disposed in between the passivation layer 18 and the transparent shielding electrode 20. The adhesive layer 28 can be, for example but not limited to, an optical clear adhesive (OCA) or a pressure sensitive adhesive (PSA). The optical film 30 can be an organic film such as polyethylene terephthalate (PET) film, polycarbonate (PC) film, or polymethylmethacrylate (PMMA) film, but not limited to this.

In this embodiment, the patterned compensation electrode 16 of the touch panel 10 includes a connecting line disposed in the peripheral region 12P of the substrate 12 and encompassing the sensor region 12S as shown in FIG. 2. The passivation layer 18 has a plurality of openings 18A (not shown in FIG. 1) exposing portions of the connecting line. A plurality of connection structures 22 respectively fill in the openings 18A to form a plurality of connection terminals which create electrical connections between the transparent shielding electrode 20 and the connecting line. The connecting line may have a compensation bias or may be grounded. Each of the connection structures 22 can include a conductive adhesive (such as silver glue, gold glue, or any suitable conductive glue), a conductive ball (such as gold ball, silver ball, or any suitable conductive ball), or a conductive bump (such as gold bump, silver bump, or any suitable conductive bump), but not limited to this. The patterned compensation electrode 16 of this embodiment has a compensation bias. The compensation bias is transferred to the transparent shielding electrode 20 through the connection structures 22, and thus the transparent shielding electrode 20 obtains its shielding effect. Consequently, accuracy of the touch panel 10 is prevented from any influence generated from mechanical distortion when the user touches the touch panel 10. The transparent shielding electrode 20 can be a planar electrode or a patterned electrode such as a grid-shaped electrode. Additionally, since there are plural connection terminals between the connecting line, which serve as the patterned compensation electrode 16, and the transparent shielding electrode 20, the compensation bias may be transferred to the transparent shielding electrode 20 rapidly and smoothly. Accordingly, the shielding effect provided by the transparent shielding electrode 20 is improved substantially. Furthermore, since the conductive adhesive, the conductive bumps, or the conductive balls are employed to serve as the connection structures 22, the adhesion between the transparent shielding electrode 20 and the patterned compensation electrode 16 is superior and thus the reliability of the touch panel 10 is improved.

In this embodiment, the patterned compensation electrode 16 may include a patterned transparent compensation electrode. Preferably, the patterned compensation electrode 16 and the transparent sensor electrode pattern 14 are formed by the same transparent conductive layer such as indium tin oxide (ITO), indium zinc oxide (IZO), aluminum zinc oxide (AZO), indium oxide, tin oxide, aluminum oxide, or any suitable materials. Consequently, the patterned compensation electrode 16 is formed without any extra process, but not limited to this. In other embodiments, the patterned compensation electrode 16 and the transparent sensor electrode pattern 14 are disposed on the same insulating layer 26, but the patterned compensation electrode 16 may include metal, for example, metal alloy, or any suitable material.

The touch panel is not limited to above mentioned embodiment. Accordingly, the disclosure further provides touch panels according to other different embodiments or modifications. To simplify the description, the identical components in each of the following are designated by the same numerals. For making it easier to compare the difference between the preferred embodiments, the following description will detail the dissimilarities among different embodiments and the identical features will not be redundantly described.

Figure 3:
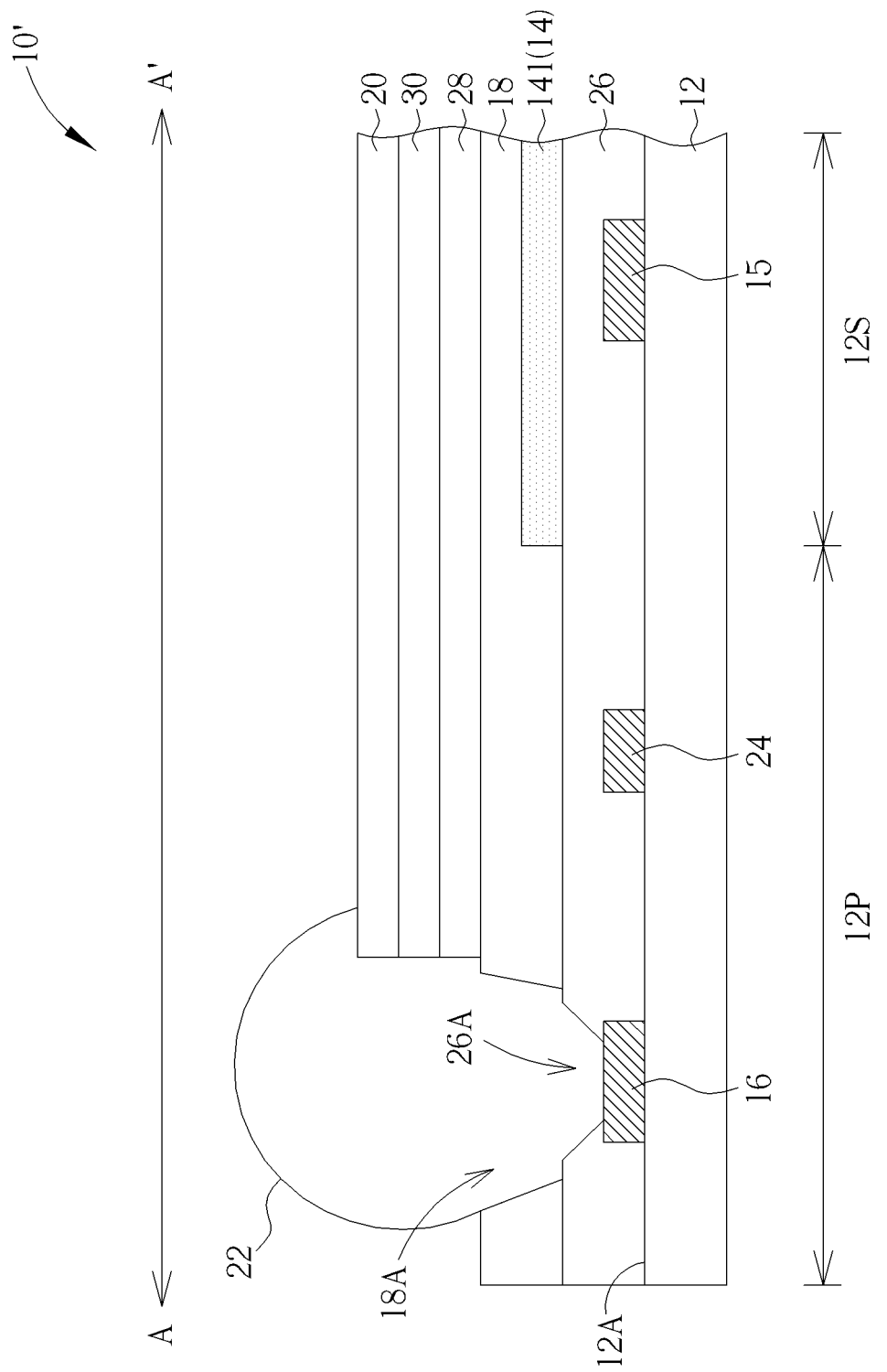
FIG. 3 is a cross-sectional view of a touch panel provided by a first modification to the first embodiment of the disclosure.

Please refer to FIG. 3. In order to clearly describe the structure of the disclosure, FIG. 1 should also be referred together. FIG. 3 is a cross-sectional view of a touch panel provided by a first modification to the first embodiment of the disclosure. As shown in FIG. 1 and FIG. 3, the patterned compensation electrode 16 of the touch panel 10' provided by the first modification includes a patterned metal compensation electrode. The patterned metal compensation electrode, the signal lines 24, and the metal connecting bridge 15 are preferably formed by the same metal layer. Accordingly, the patterned metal compensation electrode is formed without any extra process, but not limited to this. In other embodiments, the patterned compensation electrode 16, the signal lines 24, and the metal connecting bridge 15 are disposed on the substrate 12, but the patterned compensation electrode 16 can be made of transparent conductive material. The insulating layer 26 has the openings 26A corresponding to the openings 18A of the passivation layer 18 for partially exposing the patterned metal compensation electrode. Therefore, the connection structures 22 fill in the openings 18A of the passivation layer 18 and the openings 26A of the insulating layer 26 to form a plurality of connection terminals electrically connecting the transparent shielding electrode 20 and the connecting line.

Figure 4:
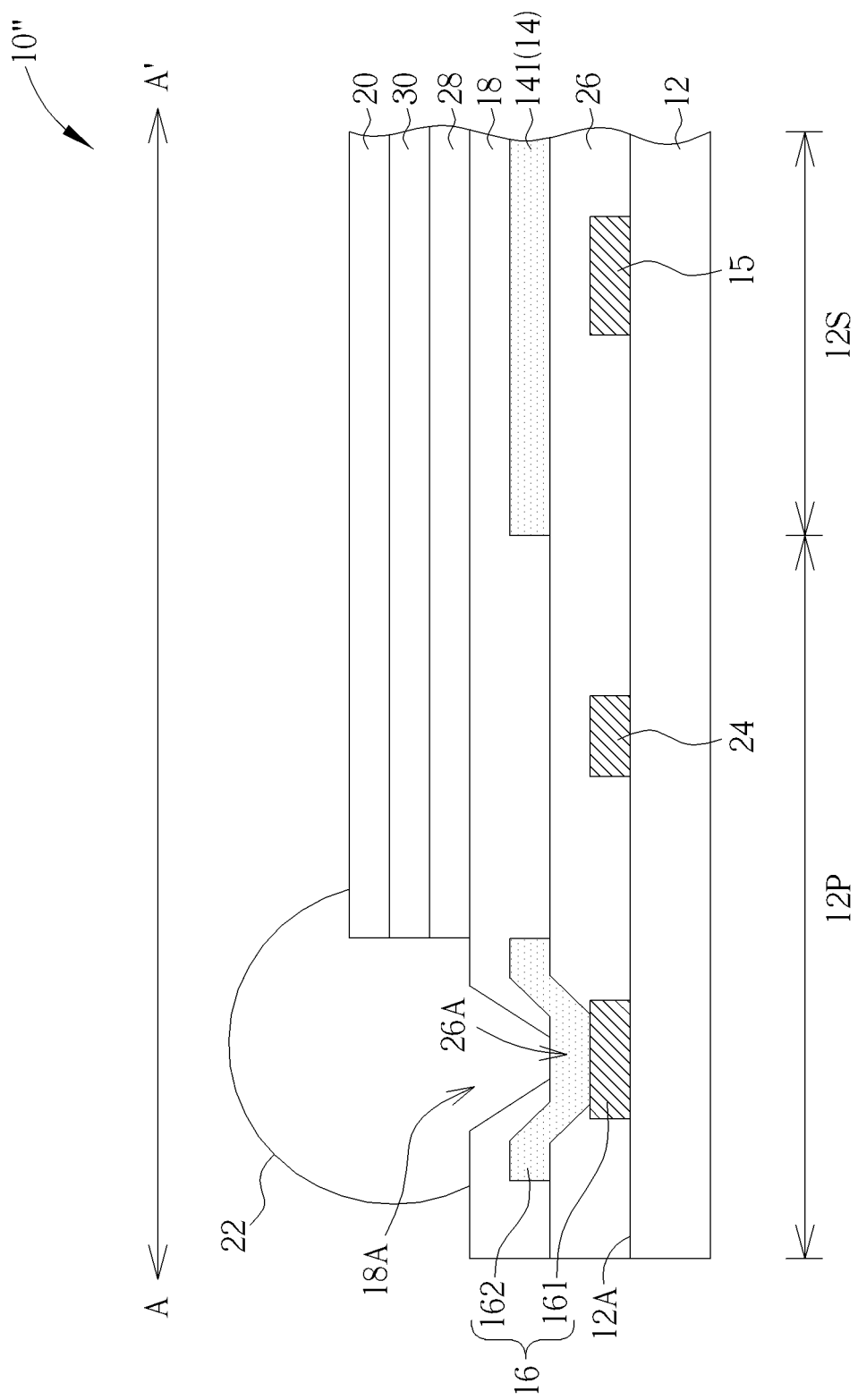
FIG. 4 is a cross-sectional view of a touch panel provided by a second modification to the first embodiment of the disclosure.

Please refer to FIG. 4. In order to clearly describe the structure of the disclosure, FIG. 1 should also be referred together. FIG. 4 is a cross-sectional view of a touch panel provided by a second modification to the first embodiment of the disclosure. As shown in FIG. 1 and FIG. 4, the patterned compensation electrode 16 of the touch panel 10" provided by the second modification includes a patterned metal compensation electrode 161 and a patterned transparent compensation electrode 162 stacked on the patterned metal compensation electrode 161. The patterned metal compensation electrode 161 and the patterned transparent compensation electrode 162 are electrically connected to each other. The patterned metal compensation electrode 161, the signal lines 24, and the metal connecting bridge 15 are preferably formed by the same patterned metal layer while the patterned transparent compensation electrode 162 and the transparent sensor electrode pattern 14 are preferably formed by the same patterned transparent conductive layer. Therefore, the patterned metal compensation electrode 161 and the patterned transparent compensation electrode 162 are formed without any extra process, but not limited to this.

Figure 5:
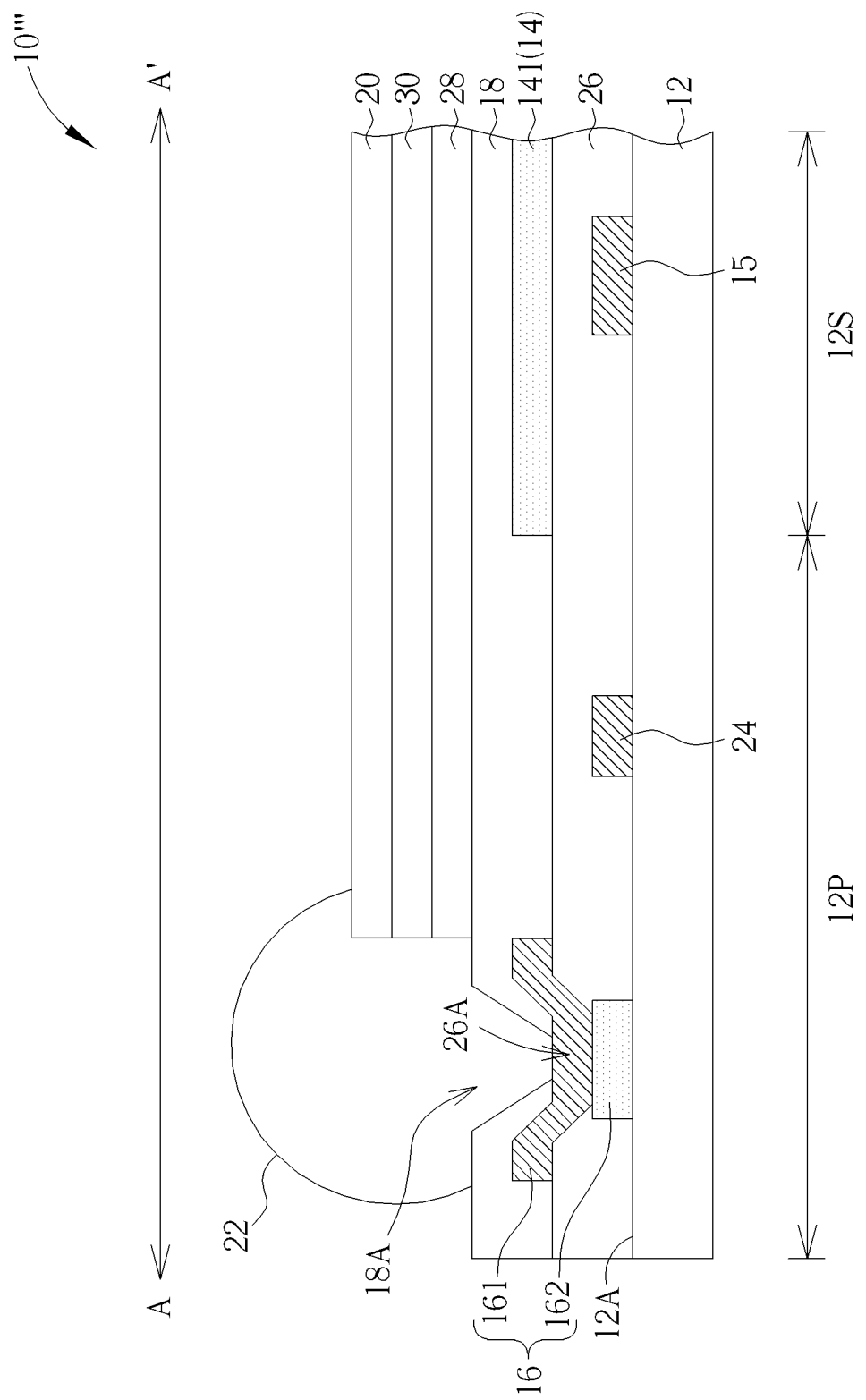
FIG. 5 is a cross-sectional view of a touch panel provided by a third modification to the first embodiment of the disclosure.

Please refer to FIG. 5. In order to clearly describe the structure of the disclosure, FIG. 1 should also be referred together. FIG. 5 is a cross-sectional view of a touch panel provided by a third modification to the first embodiment of the disclosure. As shown in FIG. 1 and FIG. 5, the patterned compensation electrode 16 of the touch panel 10''' provided by the third modification includes a patterned metal compensation electrode 161 and a patterned transparent compensation electrode 162 stacked under the patterned metal compensation electrode 161. The patterned metal compensation electrode 161 and the patterned transparent compensation electrode 162 are electrically connected to each other.

Figure 6:
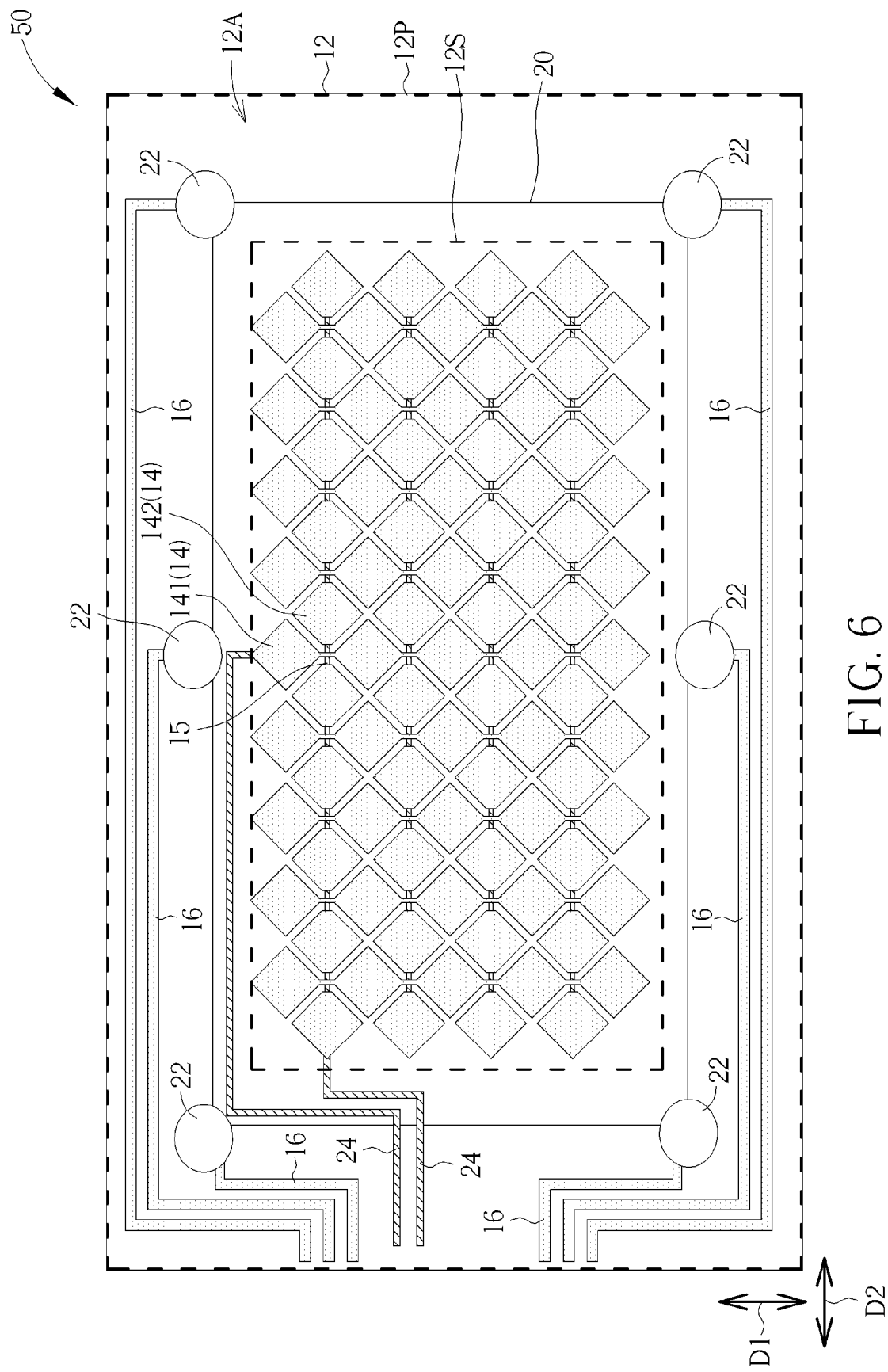
FIG. 6 is a schematic diagram illustrating a touch panel provided by a second embodiment of the disclosure.

Please refer to FIG. 6. In order to clearly describe the structure of the disclosure, FIGS. 2-5 should also be referred together. FIG. 6 is a schematic diagram illustrating a touch panel provided by a second embodiment of the disclosure. Different from the first embodiment, as shown in FIG. 6, the patterned compensation electrode 16 of the touch panel 50 provided by the second embodiment includes a plurality of the connecting lines, and the passivation layer 18 (as shown in FIGS. 2-5) has a plurality of openings 18A for partially exposing each of the connecting lines. The plurality of connection structures 22 respectively fill in the openings 18A to form a plurality of connection terminals, which create electrical connections between the transparent shielding electrode 20 and the connecting lines. Additionally, each of the connecting lines has the same compensation bias, or at least portions of the connecting lines have different compensation bias. In this embodiment, each of the connecting lines of the patterned compensation electrode 16 and the transparent shielding electrode 20 may have one connection terminal. Or, each of the connecting lines and the transparent shielding electrode 20 may have plural connection terminals. Furthermore, the structure of the patterned compensation electrode 16 in this embodiment may be similar to the structures as shown in FIGS. 2-5. For example, the patterned compensation electrode 16 can be a single-layered electrode structure (as shown in FIG. 2 or FIG. 3), or a multi-layered electrode structure (as shown in FIG. 4 or FIG. 5).

Figure 7:
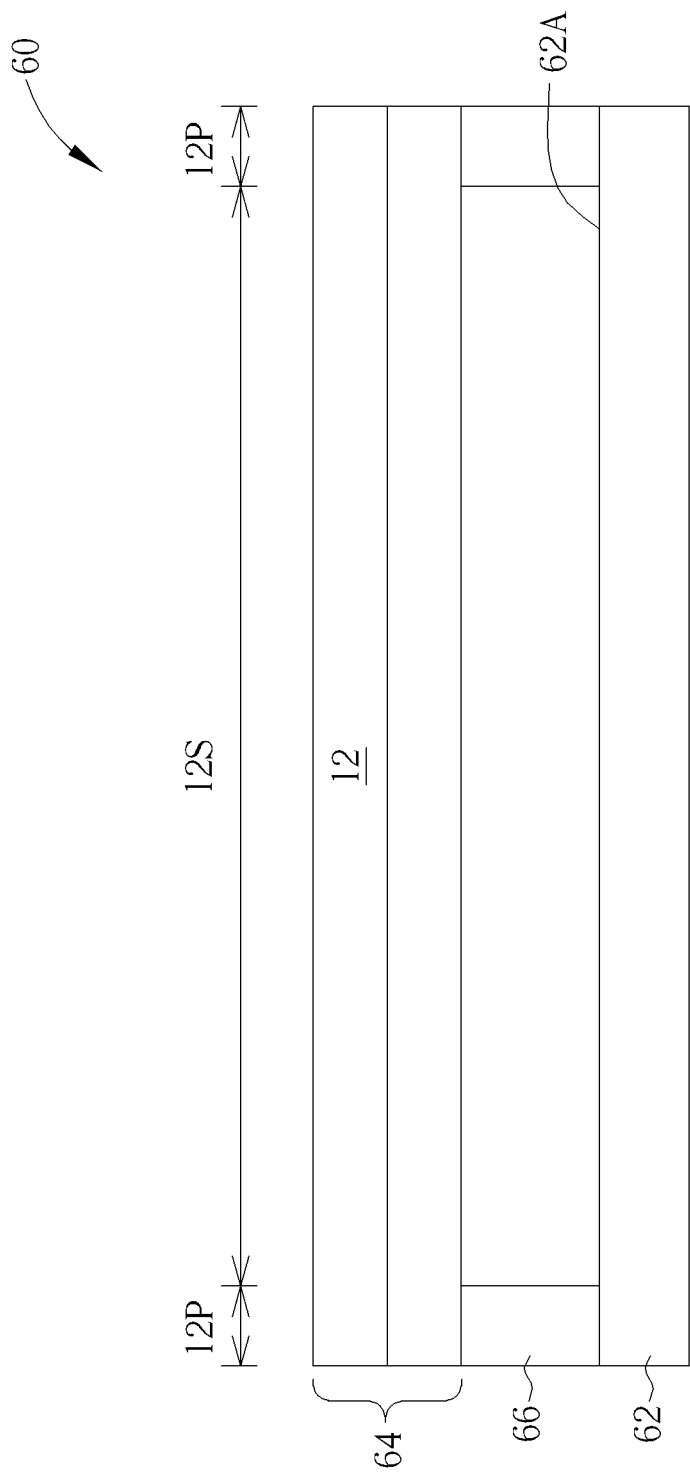
FIG. 7 is a schematic diagram illustrating a touch display panel provided by an embodiment of the disclosure.

Please refer to FIG. 7. In order to clearly describe the structure of the disclosure, FIGS. 1-6 should also be referred together. FIG. 7 is a schematic diagram illustrating a touch display panel provided by an embodiment of the disclosure. As shown in FIG. 7, the touch display panel 60 of the preferred embodiment includes a display panel 62, a touch panel 64, and an adhesive layer 66. The display panel 62 includes a display surface 62A for displaying frames. According to different displaying media, the display panel 62 can be classified into non-self-luminous display panel or self-luminous display panel. The non-self-luminous display panel includes, for example, liquid crystal display panel (for example: horizontal electric field type liquid crystal display panel, vertical electric field type liquid crystal display panel, optically compensated bend (OCB) liquid crystal display panel, cholesteric liquid crystal display, blue phase liquid crystal display, or any suitable liquid crystal display panel), electro-phoretic display panel, electrowetting display panel, or any suitable display panel. The self-luminous display panel includes, for example, organic electroluminescent display panel, plasma display panel, field emission display panel, or any suitable display panel. The touch panel 64 is disposed correspondingly to the display surface 62A of the display panel 62. The touch panel 64 can be any one of touch panels disclosed in the abovementioned embodiment as shown in FIGS. 1-6, therefore those details are omitted for simplicity. The adhesive layer 66 is disposed in between the display panel 62 and the touch panel 64 for assembling the display panel 62 and the touch panel 64. In this embodiment, the adhesive layer 66 exemplarily includes a double-sided adhesive, but not limited to this. The adhesive layer 66 is disposed correspondingly to the peripheral region 12P of the substrate 12 of the touch panel 64. A gap is formed between the touch panel 64 and the display panel 62 in the sensor region 12S. Since the touch panel 64 includes the transparent shielding electrode and the patterned compensation electrode, the transparent shielding electrode provides a superior shielding effect. And thus accuracy of the touch panel 64 is prevented from any influence generated from distortion upon the user's touch. It should be noted that the touch display panel of the disclosure is not limited to the above mentioned embodiment. In other words, the display panel 62 exemplarily includes two corresponding substrates (not shown) and a display medium (not shown) sandwiched therebetween. However, the display panel 62 can include only one substrate (not shown) on which the substrate 12 of the touch panel 64 is disposed according to other embodiments. The adhesive layer 66 is disposed in between the substrate (not shown) of the display panel 62 and the substrate 12 of the touch panel 64 for assembling the display panel 62 and the touch panel 64. The gap is formed in between the substrate (not shown) of the display panel 62 and the substrate 12 of the touch panel 64, and is filled with the displaying medium of the display panel 62.

Figure 8:
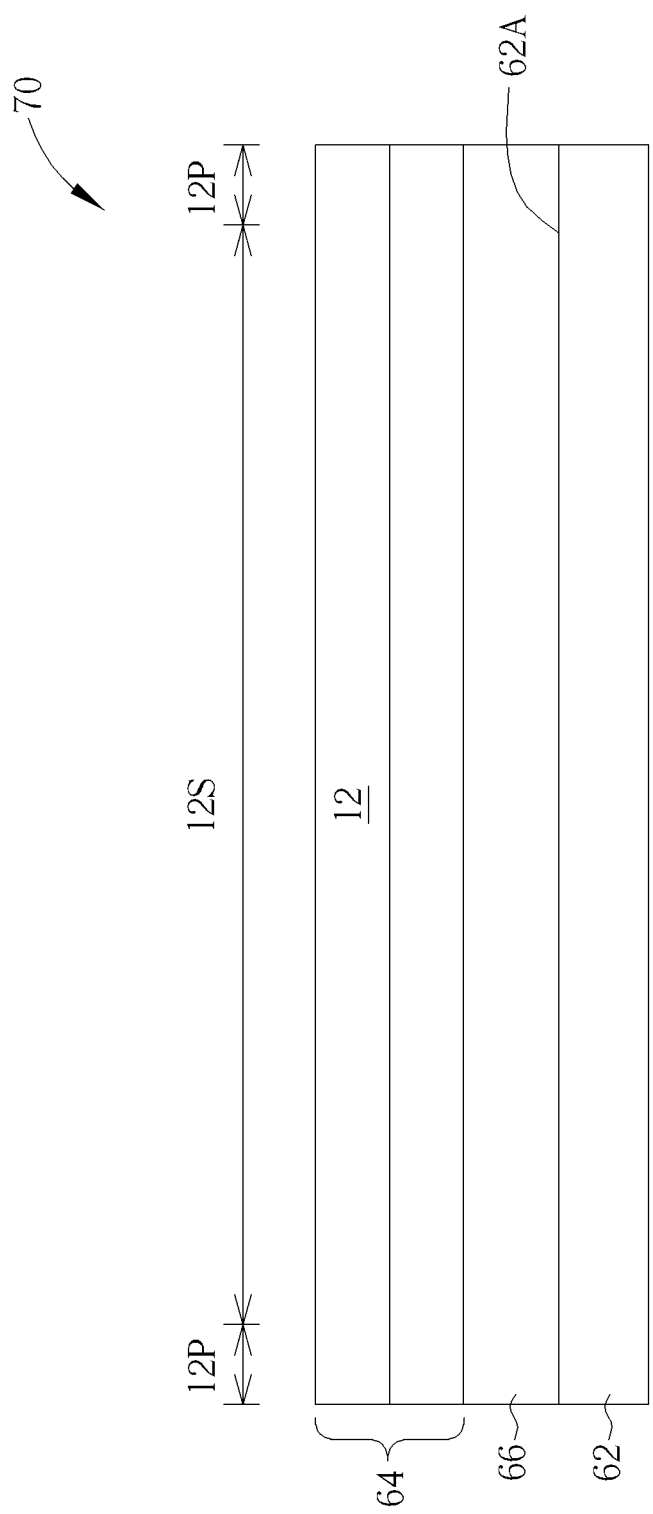
FIG. 8 is a schematic diagram illustrating a touch display panel provided by another embodiment of the disclosure.

Please refer to FIG. 8. In order to clearly describe the structure of the disclosure, FIGS. 1-6 should also be referred together. FIG. 8 is a schematic diagram illustrating a touch display panel provided by another embodiment of the disclosure. Different from the aforementioned preferred embodiments, as shown in FIG. 8, the display panel 62 of the touch display panel 70 provided by this embodiment exemplarily includes two corresponding substrates (not shown) and a displaying medium sandwiched therebetween. The adhesive layer 66 exemplarily includes an optical adhesive or a pressure sensitive adhesive. The adhesive layer 66 is disposed in between the substrate 12 of the touch panel 64 and one of the substrates of the display panel 62 that is corresponding to the touch panel 64. For example, the adhesive layer 66 is disposed in between the outer surface of the substrate 12 and the outer surface of one of the substrates of the display panel 62. The adhesive layer 66 is disposed correspondingly on the peripheral region 12P and the sensor region 12S, which means it covers the areas where the substrate 12 of the touch panel 64 and the display panel 62 overlap. Therefore, there is no gap formed in between the display panel 62 and the touch panel 64. Similarly, since the touch panel 64 includes the transparent shielding electrode and the patterned compensation electrode, the transparent shielding electrode provides a superior shielding effect. And thus accuracy of the touch panel 64 is prevented from any influence generated from distortion upon the user's touch.

In conclusion, the touch panel and touch display panel provided by the disclosure includes the transparent shielding electrode and the patterned compensation electrode. By introducing the plural connection terminals formed by the connection structure between the transparent shielding electrode and the patterned compensation electrode, the transparent shielding electrode renders a superior shielding effect. Therefore accuracy of the touch panel is prevented from any influence generated from distortion upon the user's touch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch panel, comprising:
   a substrate having a surface, the substrate comprising a sensor region and a peripheral region;
   a transparent sensor electrode pattern, disposed on the surface of the substrate and in the sensor region;
   a patterned compensation electrode, disposed on the surface of the substrate and in the peripheral region, the patterned compensation electrode being electrically isolated from the transparent sensor electrode pattern;
   a passivation layer, disposed on the surface of the substrate, the passivation layer covering the transparent sensor electrode pattern and at least partially exposing the patterned compensation electrode;
   a transparent shielding electrode, disposed on the passivation layer; and
   at least one connection structure, electrically connected to the transparent shielding electrode and the patterned compensation electrode exposed by the passivation layer.

2. The touch panel of claim 1, wherein the patterned compensation electrode comprises at least one connecting line, the passivation layer has a plurality of openings partially exposing the connecting line, and the at least one connection structure comprises a plurality of connection structures respectively filling in the openings to form a plurality of connection terminals creating electrical connections between the transparent shielding electrode and the connecting line.

3. The touch panel of claim 2, wherein the connecting line has a compensation bias.

4. The touch panel of claim 1, wherein the patterned compensation electrode comprises a plurality of connecting lines, the passivation layer has a plurality of openings respectively exposing a portion of each connecting line, and the at least one connection structure comprises a plurality of connection structures respectively filling in the openings to form a plurality of connection terminals creating an electrical connection between the transparent shielding electrode and each connecting line.

5. The touch panel of claim 4, wherein the connecting lines have an identical compensation bias, or at least portions of the connecting lines have different compensation bias.

6. The touch panel of claim 1, wherein the at least one connection structure comprises at least one conductive bump, at least one conductive ball, or at least one conductive adhesive.

7. The tough panel of claim 1, wherein the patterned compensation electrode comprises a patterned transparent compensation electrode.

8. The touch panel of claim 7, wherein the patterned transparent compensation electrode and the transparent sensor electrode pattern are formed by a same transparent conductive layer.

9. The touch panel of claim 1, wherein the patterned compensation electrode comprises a patterned metal compensation electrode.

10. The touch panel of claim 1, wherein the patterned compensation electrode comprises a patterned metal compensation electrode and a patterned transparent compensation electrode stacked on the patterned metal compensation electrode or under the patterned metal compensation electrode, and the patterned metal compensation electrode and the patterned transparent compensation electrode are electrically connected to each other.

11. The touch panel of claim 10, wherein the patterned transparent compensation electrode and the transparent sensor electrode pattern are formed by a same transparent conductive layer.

12. A touch display panel comprising:
    a display panel having a display surface;
    the touch panel of claim 1, disposed on the display surface of the display panel; and
    an adhesive layer, disposed in between the display panel and the touch panel, the adhesive layer assembling the display panel and the touch panel.

13. The touch display panel of claim 12, wherein the adhesive layer is correspondingly disposed on the peripheral region of the substrate of the touch panel.

14. The touch display panel of claim 12, wherein the adhesive layer is correspondingly disposed on the sensor region and the peripheral region of the substrate of the touch panel.